(12) United States Patent
Yamada (10) Patent No.: US 11,831,067 B2
(45) Date of Patent: Nov. 28, 2023

(54) ELECTRONIC APPARATUS AND METHOD OF MANUFACTURING ELECTRONIC APPARATUS

(71) Applicant: KABUSHIKI KAISHA TOSHIBA, Minato-ku (JP)

(72) Inventor: Keiju Yamada, Yokohama (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 600 days.

(21) Appl. No.: 16/803,483

(22) Filed: Feb. 27, 2020

(65) Prior Publication Data

US 2021/0013586 A1    Jan. 14, 2021

(30) Foreign Application Priority Data

Jul. 12, 2019   (JP) ................. 2019-130233

(51) Int. Cl.
| | | |
|---|---|---|
| *H01Q 1/22* | (2006.01) | |
| *H01L 23/31* | (2006.01) | |
| *H01L 23/498* | (2006.01) | |
| *H01L 23/66* | (2006.01) | |
| *H01Q 13/10* | (2006.01) | |

(Continued)

(52) U.S. Cl.
CPC ....... *H01Q 1/2283* (2013.01); *H01L 23/3114* (2013.01); *H01L 23/49838* (2013.01); *H01L 23/66* (2013.01); *H01L 24/48* (2013.01); *H01M 10/44* (2013.01); *H01Q 1/38* (2013.01); *H01Q 13/106* (2013.01); *H01L 2223/6677* (2013.01);

(Continued)

(58) Field of Classification Search
CPC .......... H01L 23/3114; H01L 23/49838; H01L 2223/6677; H01Q 1/2283
See application file for complete search history.

(56) References Cited

U.S. PATENT DOCUMENTS

| | | | |
|---|---|---|---|
| 9,793,202 B1 | 10/2017 | Hashimoto et al. | |
| 2008/0079565 A1* | 4/2008 | Koyama | A61B 5/0002 340/539.1 |

(Continued)

FOREIGN PATENT DOCUMENTS

| | | |
|---|---|---|
| JP | 2004-242034 A | 8/2004 |
| JP | 2013-179449 A | 9/2013 |

(Continued)

*Primary Examiner* — Sarah K Salerno
(74) *Attorney, Agent, or Firm* — Oblon, McClelland, Maier & Neustadt, L.L.P.

(57) ABSTRACT

According to an embodiment, an electronic apparatus includes a substrate, a semiconductor device, a non-conductive portion, first and second metal films, and a rechargeable battery. The semiconductor device is mounted on a first surface of the substrate and includes a wireless circuit. The non-conductive portion is formed on the first surface to seal the semiconductor device. The first metal film is provided along a surface of the non-conductive portion and at least one edge surface of the substrate to contact at the edge surface with a first-wire disposed on the substrate. The second metal film is provided along the surface of the non-conductive portion and the edge surface and separately from the first metal film to contact at the edge surface with a second-wire disposed on the substrate. The rechargeable battery includes first and second electrodes electrically connected to the first-wire and to the second-wire, respectively.

10 Claims, 8 Drawing Sheets

(51) Int. Cl.
 *H01Q 1/38* (2006.01)
 *H01M 10/44* (2006.01)
 *H01L 23/00* (2006.01)

(52) U.S. Cl.
 CPC .............. *H01L 2224/48227* (2013.01); *H01L 2924/3025* (2013.01)

(56) References Cited

U.S. PATENT DOCUMENTS

| | | |
|---|---|---|
| 2013/0222196 A1 | 8/2013 | Hashimoto et al. |
| 2018/0053987 A1 | 2/2018 | Yamada et al. |
| 2018/0123261 A1 | 5/2018 | Sano et al. |
| 2018/0205133 A1 | 7/2018 | Hashimoto et al. |
| 2018/0226722 A1* | 8/2018 | Yamada ................. H01Q 13/10 |
| 2019/0131712 A1 | 5/2019 | Yamada et al. |
| 2019/0214716 A1* | 7/2019 | Yamada ................. H01L 23/66 |
| 2019/0288375 A1 | 9/2019 | Yamada et al. |

FOREIGN PATENT DOCUMENTS

| | | |
|---|---|---|
| JP | 2017-122739 A | 7/2017 |
| JP | 2018-23060 A | 2/2018 |
| JP | 2018-29286 A | 2/2018 |
| JP | 2018-74506 A | 5/2018 |
| JP | 2018-117215 A | 7/2018 |
| JP | 2018-129596 A | 8/2018 |
| JP | 2019-121993 A | 7/2019 |

\* cited by examiner

ELECTRONIC APPARATUS AND METHOD OF MANUFACTURING ELECTRONIC APPARATUS

CROSS-REFERENCE TO RELATED APPLICATIONS

This application is based upon and claims the benefit of priority from Japanese Patent Application No. 2019-130233, filed on Jul. 12, 2019; the entire contents of which are incorporated herein by reference.

FIELD

Embodiments described herein relate to an electronic apparatus and a method of manufacturing an electronic apparatus.

BACKGROUND

Conventionally, techniques for realizing downsizing of wireless devices have been proposed. A demand exists for stand-alone operation of such small wireless devices that are not dependent on power supplied from external devices. To realize this, mounting a rechargeable battery on a small wireless device is considered.

When a rechargeable battery is mounted on a small wireless device, the wireless device needs to be provided with a charging pad (metal pattern) that makes contact with a terminal of a charger (cradle) during charging of the rechargeable battery. Even when the rechargeable battery is mounted, downsizing of the wireless device is desired.

DETAILED DESCRIPTION

According to an embodiment, an electronic apparatus (e.g., wireless device) includes a substrate, a semiconductor device, a non-conductive portion, a first metal film, a second metal film, and a rechargeable battery. The semiconductor device is mounted on a first surface of the substrate and includes a wireless circuit. The non-conductive portion is formed on the first surface of the substrate to seal the semiconductor device. The first metal film is provided on (along from) a surface of the non-conductive portion and (to) at least one edge surface of the substrate to make contact at the edge surface with a first wire disposed on (along) the substrate. The second metal film is provided on (along from) the surface of the non-conductive portion and (to) the at least one edge surface of the substrate and separately from the first metal film to make contact at the edge surface with a second wire disposed on (along) the substrate. The rechargeable battery includes a first electrode electrically connected to the first wire and a second electrode electrically connected to the second wire. The wireless device and a method of manufacturing the wireless device according to embodiments will be described in detail below with reference to the accompanying drawings. In the following description, the identical reference numerals refer to components having identical or similar functions, and repetitive explanations are omitted as appropriate.

First Embodiment

Figure 1:
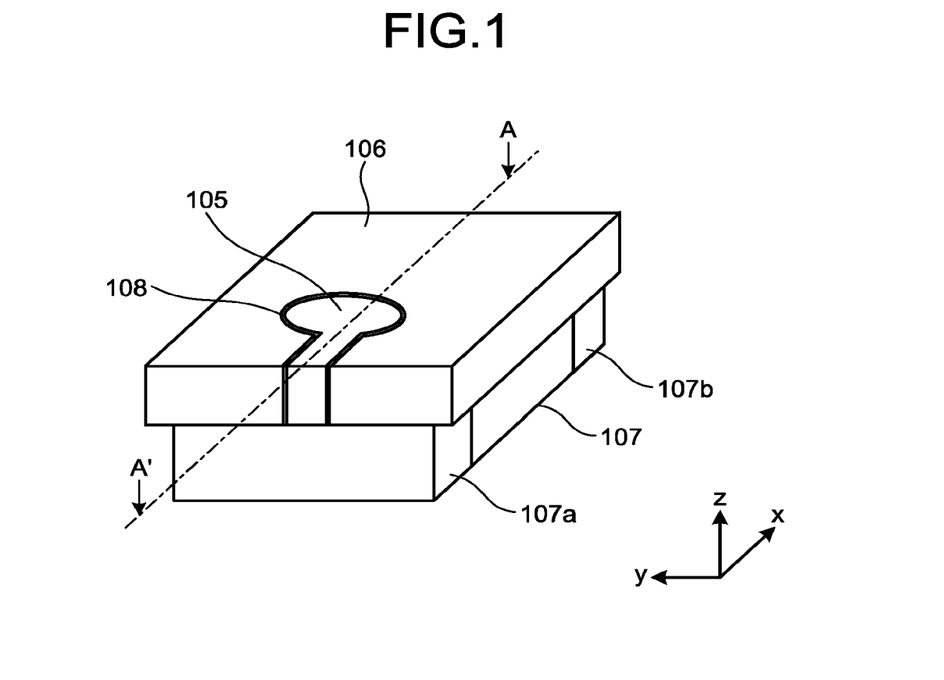
FIG. 1 is a perspective view illustrating the appearance of an electronic apparatus (e.g., wireless device) according to a first embodiment.
Figure 2:
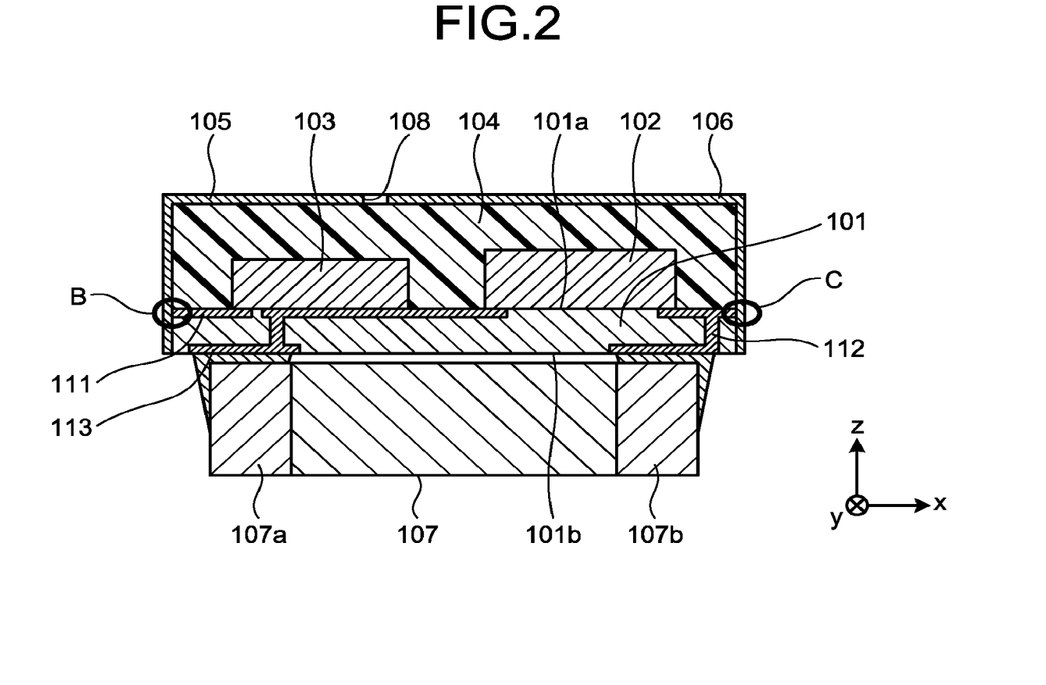
FIG. 2 is a side view of the wireless device according to the first embodiment.

First, the structure of a wireless device according to a first embodiment will be described with reference to FIGS. 1 and 2. FIG. 1 is a perspective view illustrating the appearance of the wireless device according to the first embodiment. FIG. 2 is a cross-sectional view on a plane parallel with an XZ plane passing through a line A-A' in FIG. 1.

The wireless device according to the first embodiment includes a substrate 101, a wireless circuit 102 and a power circuit 103 that are semiconductor devices, a sealing resin 104, a first metal film 105, a second metal film 106, and a rechargeable battery 107.

The substrate 101 includes an insulating base and a pattern of wires made of a conductive material such as copper is formed on the base. The wires are disposed on a first surface 101a of the substrate 101 and a second surface 101b corresponding to an opposite side of the first surface 101a. A particular wire of the wires disposed on the first surface 101a is connected to a particular wire of the wires disposed on the second surface 101b through a via that goes through the substrate 101. FIG. 2 illustrates a first wire 111, a second wire 112, and a third wire 113 as an example of the wires disposed on the substrate 101. One end of the first wire 111 reaches one edge surface of the substrate 101, and one end of the second wire 112 reaches another edge surface of the substrate 101.

The semiconductor devices such as the wireless circuit 102 and the power circuit 103 each include a semiconductor substrate made of, for example, silicon, silicon-germanium and gallium arsenide, and a metal pattern of, for example, copper, aluminum and gold, formed inside or on the semiconductor substrate. The semiconductor devices are mounted on the first surface 101a of the substrate 101 to be connected to the wires disposed on the first surface 101a. For example, the power circuit 103 is connected to the first wire 111 and the third wire 113, and the wireless circuit 102 to the third wire 113 and the second wire 112. The third wire 113 is provided along from the second surface 101b of the substrate 101 to the first surface 101a of the substrate 101 through a via that goes through the substrate 101, to be connected to the power circuit 103 and the wireless circuit 102 on the first surface 101a of the substrate 101. The second wire 112 is provided along from the second surface 101b of the substrate 101 to the first surface 101a of the substrate 101 through a via that goes through the substrate 101, to be connected to the wireless circuit 102 and the second metal film 106 on the first surface 101a of the substrate 101. The semiconductor devices such as the wireless circuit 102 and the power circuit 103 may be constituted with a dielectric substrate, a magnetic substrate, a metal, or a combination thereof. The semiconductor devices such as the wireless circuit 102 and the power circuit 103 may employ a chip size package (CSP) structure, or a face-up structure to be connected to a bonding wire.

Although FIG. 2 illustrates the example in which the two semiconductor devices of the wireless circuit 102 and the power circuit 103 are mounted on the first surface 101a of the substrate 101, only the wireless circuit 102 may be mounted. A semiconductor device other than the wireless circuit 102 and the power circuit 103 may be also mounted. An electronic component, such as a chip capacitor, a resistor, an inductor, a crystal oscillator and an integrated circuit (IC), may be mounted in addition to the semiconductor devices. Additionally, the power circuit 103 may include, for example, a resistor and a capacitor without including the semiconductor device.

The sealing resin 104 is made of a thermosetting molding material that is, for example, composed mainly of epoxy resin and silica filler added thereto. The sealing resin 104 is formed on the first surface 101a of the substrate 101 to function as sealing and protecting the semiconductor devices such as the wireless circuit 102 and the power circuit 103. The sealing resin 104 is an example of a non-conductive portion (layer) for sealing the semiconductor devices. The non-conductive portion (layer) is not limited to resin and may be made of a non-conductive material or an insulating material other than the resin.

The first metal film 105 and the second metal film 106 are formed, for example, from conductive material with high conductivity, such as copper and silver, or a conductive paste that is a mixture of a conductive material, such as silver, and an insulating material, such as epoxy resin. The first metal film 105 and the second metal film 106 are provided along from a surface (outer surface) of the sealing resin 104 to an edge surface of the substrate 101. The first metal film 105 and the second metal film 106 may include a layer of titanium or SUS in order to prevent oxidation and improve adhesion of the metal film. The first metal film 105 and the second metal film 106 are separated from each other to be electrically insulated from each other. The first metal film 105 and the second metal film 106 are formed, for example, by performing cutting with respect to (i.e. by cutting) an integral metal film formed over (along) the surface of the sealing resin 104 and the edge surfaces of the substrate 101 to form a slit-shaped gap 108 and by separating the integral metal film by the gap 108.

The first metal film 105 makes contact with the first wire 111 of the substrate 101 at the edge surface of the substrate 101 (see B in FIG. 2) to be connected to the first wire 111. The second metal film 106 makes contact with the second wire 112 of the substrate 101 at the edge surface of the substrate 101 (see C in FIG. 2) to be connected to the second wire 112.

The rechargeable battery 107 is mounted on (at) the second surface 101b of the substrate 101 by, for example, surface-mounting using soldering so as to connect a first electrode (positive electrode) 107a to the third wire 113 disposed on the substrate 101 and a second electrode (negative electrode) 107b to the second wire 112 disposed on the substrate 101. The rechargeable battery 107 may be a lithium-ion battery, a nickel-cadmium battery, a lead-acid battery, and a solid-state battery, which are generally used in electronics, and also may be, for example, an electric double-layer capacitor.

The first electrode 107a of the rechargeable battery 107 is electrically connected to the first wire 111 via the third wire 113 and the power circuit 103 disposed on the substrate 101. The first wire 111 makes contact with the first metal film 105 at B in FIG. 2 to be electrically connected to the first metal film 105 as described above. As such, in the wireless device according to the present embodiment, the first metal film 105 is electrically connected to the first electrode 107a of the rechargeable battery 107 via the first wire 111, the power circuit 103, and the third wire 113.

The second electrode 107b of the rechargeable battery 107 is electrically connected to the second wire 112 disposed on the substrate 101. The second wire 112 makes contact with the second metal film 106 at C in FIG. 2 to be electrically connected to the second metal film 106 as described above. As such, in the wireless device according to the present embodiment, the second metal film 106 is electrically connected to the second electrode 107b of the rechargeable battery 107 via the second wire 112.

The first metal film 105 and the second metal film 106 are separated from each other to be electrically insulated from each other as described above. Consequently, the first metal film 105 and the second metal film 106 are usable as a charging pad that makes contact with a terminal of a charger (cradle) for charging the rechargeable battery 107 when the wireless device is attached to the charger.

Figure 3:
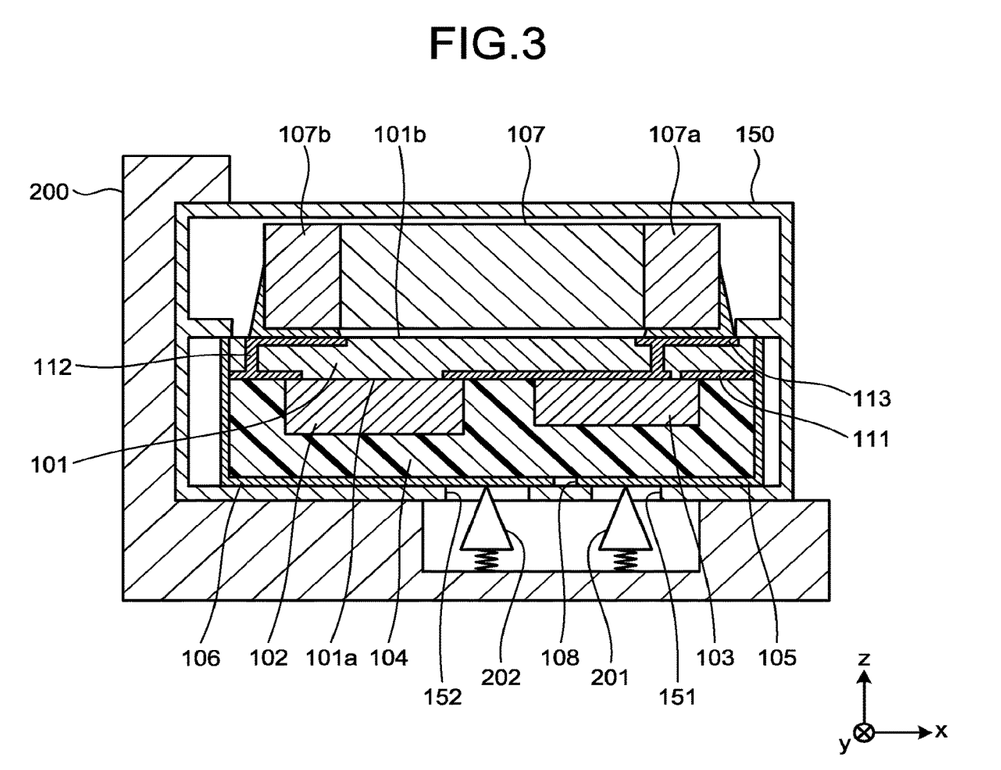
FIG. 3 is a cross-sectional view illustrating the wireless device according to the first embodiment, attached to a charger.

FIG. 3 is a cross-sectional view illustrating the wireless device according to the first embodiment, attached to a charger 200. The wireless device is accommodated in a case 150 formed from an insulator, such as resin, to be used. The case 150 includes two openings 151 and 152. When the wireless device is accommodated in the case 150, the first metal film 105 is exposed to the outside from one opening 151, and the second metal film 106 from the other opening 152.

The charger 200 includes a plus terminal 201 and a minus terminal 202 for charging. The plus terminal 201 and the minus terminal 202 are urged in an upper direction in FIG. 3 by a spring. When the wireless device accommodated in the case 150 is attached to the charger 200 as illustrated in FIG. 3, the plus terminal 201 of the charger 200 makes contact with the first metal film 105 of the wireless device via the opening 151 of the case 150, and the minus terminal 202 of the charger 200 makes contact with the second metal film 106 of the wireless device via the opening 152 of the case 150. The rechargeable battery 107 mounted in the wireless device is thereby charged.

That is, the first metal film 105 has the same potential as that of a plus electrode of the charger 200, and the second metal film 106 has the same potential as that of a ground electrode of the charger 200. The charger 200 supplies an electric current to the rechargeable battery 107 via the first metal film 105, the first wire 111, the power circuit 103 and the third wire 113 to charge the rechargeable battery 107. The second metal film 106 may have the same potential as that of the plus electrode of the charger 200, and the first metal film 105 may have the same potential as that of the ground electrode of the charger 200 by setting the first electrode 107a of the rechargeable battery 107 as a negative electrode, and the second electrode 107b as a positive electrode. The power circuit 103 may include a switching element, an inductor, a capacitor, and a protecting circuit in some embodiments. When using a power supply with the use of the switching element, the first metal film 105 and the third wire 113 have differing potentials.

When the wireless circuit 102 operates with an electric current supplied from the rechargeable battery 107 (or an electric current from the charger 200), the second metal film 106 also has the ground potential. The second metal film 106 is placed so as to partly overlap with the wireless circuit 102 (the semiconductor device) as viewed in a direction (−Z direction) perpendicular to the first surface 101a of the substrate 101. Thus, the second metal film 106 functions as an electromagnetic shield for preventing leakage of unnecessary electromagnetic waves generated during the operation of the wireless circuit 102 and entry of unnecessary electromagnetic waves from outside.

That is, in the wireless device according to the first embodiment, the second metal film 106 used as the charging pad for charging the rechargeable battery 107 also functions as the electromagnetic shield. In other words, the second metal film 106 functioning as the electromagnetic shield is used as the charging pad to charge the rechargeable battery 107. Additionally, in the present embodiment, the first metal film 105 and the second metal film 106 cover the entire surface of the sealing resin 104, and the second metal film 106 has a significantly large area compared to the area of the first metal film 105 as illustrated in FIG. 1. Consequently, the second metal film 106 satisfactorily functions as the electromagnetic shield.

Figure 4:
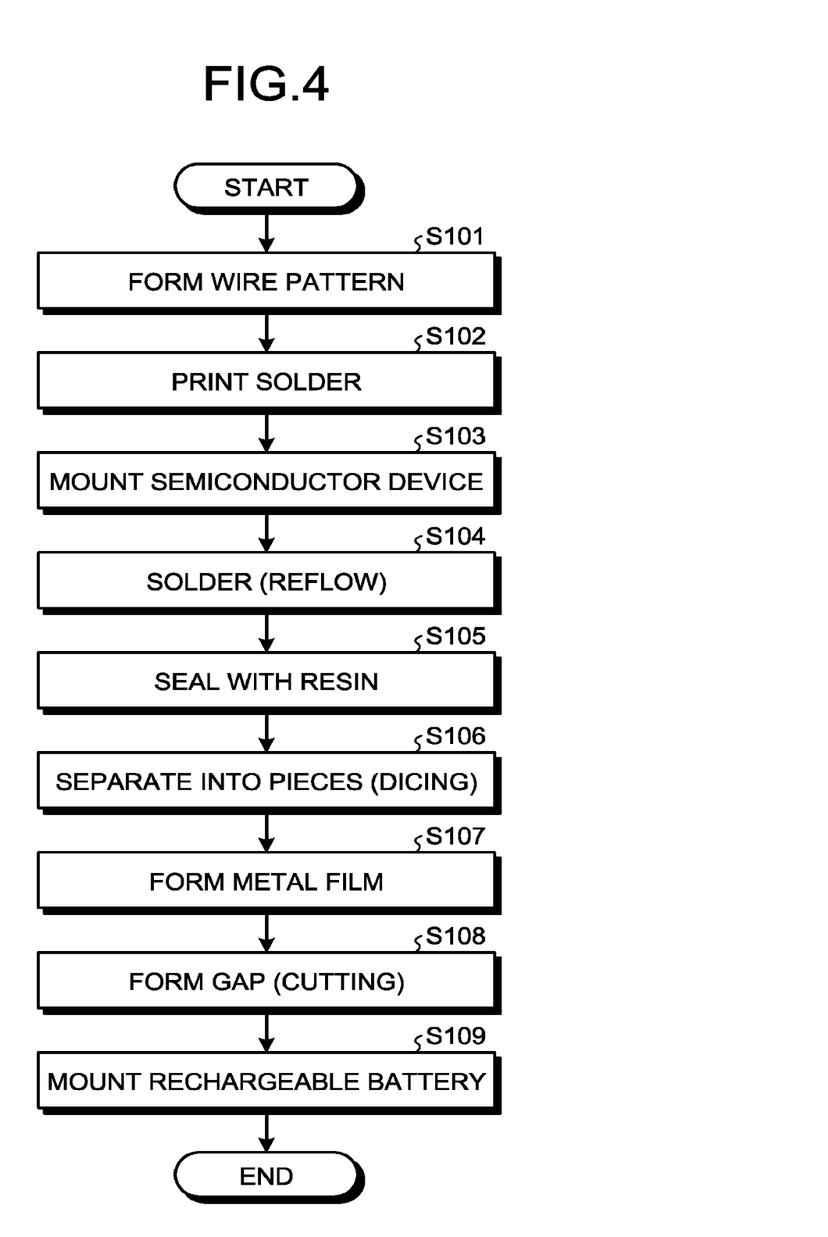
FIG. 4 is a flowchart exemplifying a method of manufacturing a wireless device according to the first embodiment.

An example of a method of manufacturing the wireless device according to the first embodiment will now be described with reference to a flowchart in FIG. 4.

First, the substrate 101 is fabricated by forming the pattern of wires including the first wire 111, the second wire 112 and the third wire 113 on a double-sided copper clad substrate, applying a solder resist over the surface of the substrate, and giving surface treatment using, for example, nickel and gold plating to the surface (step S101). Cream solder is printed on a necessary point of the substrate 101 (step S102). The semiconductor devices such as the wireless circuit 102 and the power circuit 103 are mounted on the first surface 101a of the substrate 101 (step S103) and are soldered by reflow (step S104).

By filling the sealing resin 104 onto the first surface 101a of the substrate 101 on which the semiconductor devices such as the wireless circuit 102 and the power circuit 103 are mounted, by a method such as transfer molding and compression molding, the semiconductor devices such as the wireless circuit 102 and the power circuit 103 are sealed with the sealing resin 104 (step S105). The processes of steps S101 to S105 are performed in a plurality of the individual substrates 101 arranged in a large substrate collectively.

The large substrate is then separated into pieces by dicing (step S106). The substrate 101 (an individual module), on which the semiconductor devices sealed by the sealing resin 104 are mounted, is thereby obtained. An integral metal film is formed over the surface of the sealing resin 104 and the edge surfaces of the substrate 101 by a method such as sputtering, evaporation and spraying in each module (step S107). The steps S106 and S107 may be replaced with following steps. That is, an integral metal film is formed over the surface of the sealing resin 104 and the edge surfaces of the substrate 101 by a method such as sputtering, evaporation, spraying and screen printing in a plurality of the substrates 101 arranged in a large substrate (step S106'), which is then separated into pieces by dicing (step S107').

Subsequently, for example, a laser apparatus is used to perform cutting with respect to the metal film formed at the step S107, thereby forming the slit-shaped gap 108 for the metal film (step S108). This separates the integral metal film formed at the step S107 into the first metal film 105 and the second metal film 106. The cutting process for forming the gap 108 is not limited to the method using the laser apparatus. The cutting may be performed, for example, using the laser apparatus while rotating a base for fixing the module, or using a cutting tool such as an endmill.

Lastly, the rechargeable battery 107 is surface-mounted on the second surface 101b of the substrate 101 (step S109), thus completing the wireless device according to the present embodiment. The rechargeable battery 107 may be mounted on the second surface 101b of the substrate 101 before the large substrate is separated into pieces at the step S106.

As described in detail above by giving the specific examples, the first metal film 105 and the second metal film 106 provided along the surface of the sealing resin 104 for sealing the semiconductor devices (the wireless circuit 102 and the power circuit 103) mounted on the first surface 101a of the substrate 101, to the edge surfaces of the substrate 101 function as the charging pad for charging the rechargeable battery 107 in the wireless device according to the first embodiment. This eliminates the need to provide the substrate 101 with a charging pad and to mount a charging connector on the substrate 101, for example. Thus, the substrate 101 for charging the rechargeable battery 107 does not necessitate increasing the size of the substrate 101. Consequently, the wireless device according to the first embodiment enables charging of the rechargeable battery 107 while achieving downsizing.

Additionally, the wireless device according to the first embodiment has a structure of mounting the rechargeable battery 107 on the second surface 101b corresponding to the opposite side of the first surface 101a of the substrate 101 on which the semiconductor devices such as the wireless circuit 102 are mounted, thereby enabling a necessary area for mounting the rechargeable battery 107 without increasing the size of the substrate 101, and thereby enabling the rechargeable battery 107 having a large size and capacity to be used. In particular, according to the present embodiment, the rechargeable battery 107 is mounted at (on) the second surface 101b of the substrate 101 by surface-mounting. Thus, no connector is required, and the size of the rechargeable battery 107 can be increased accordingly. Although the example in which a double-sided substrate having two conductive layers is used as the substrate 101 has been described in the present embodiment, the substrate 101 is not limited to the two-layer substrate, and a multi-layer substrate having two or more layers may be used. Using the multi-layer substrate as the substrate 101 also achieves the similar effects.

First Modification

In the wireless device according to the first embodiment, the first metal film 105 is provided in such a shape as to reach the edge surface of the substrate 101 from an upper surface parallel with the first surface 101a of the substrate 101 through one side surface intersecting with the upper surface, among the surfaces of the sealing resin 104, as illustrated in FIG. 1. As long as the first metal film 105 makes contact with the first wire 111 at the edge surface of the substrate 101 to be connected to the first wire 111, any shape may be employed.

Figure 5:
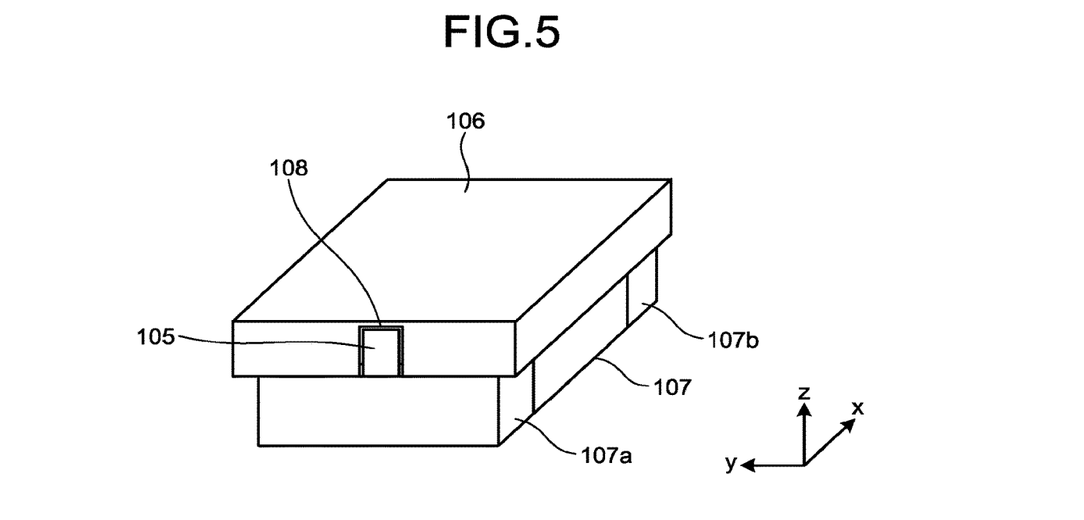
FIG. 5 is a perspective view illustrating the appearance of a wireless device of a first modification.

The first metal film 105 may be provided along from the single side surface of the sealing resin 104 to the edge surface of the substrate 101 without the first metal film 105 being provided on the upper surface of the sealing resin 104 as illustrated, for example, in FIG. 5. In the example of FIG. 5, the second metal film 106 covers the entire upper surface of the sealing resin 104 and all side surfaces of the sealing resin 104 excluding the area covered by the first metal film 105 and the gap 108. This further improves the performance of the electromagnetic shield by the second metal film 106 compared with the wireless device according to the first embodiment.

Figure 6:
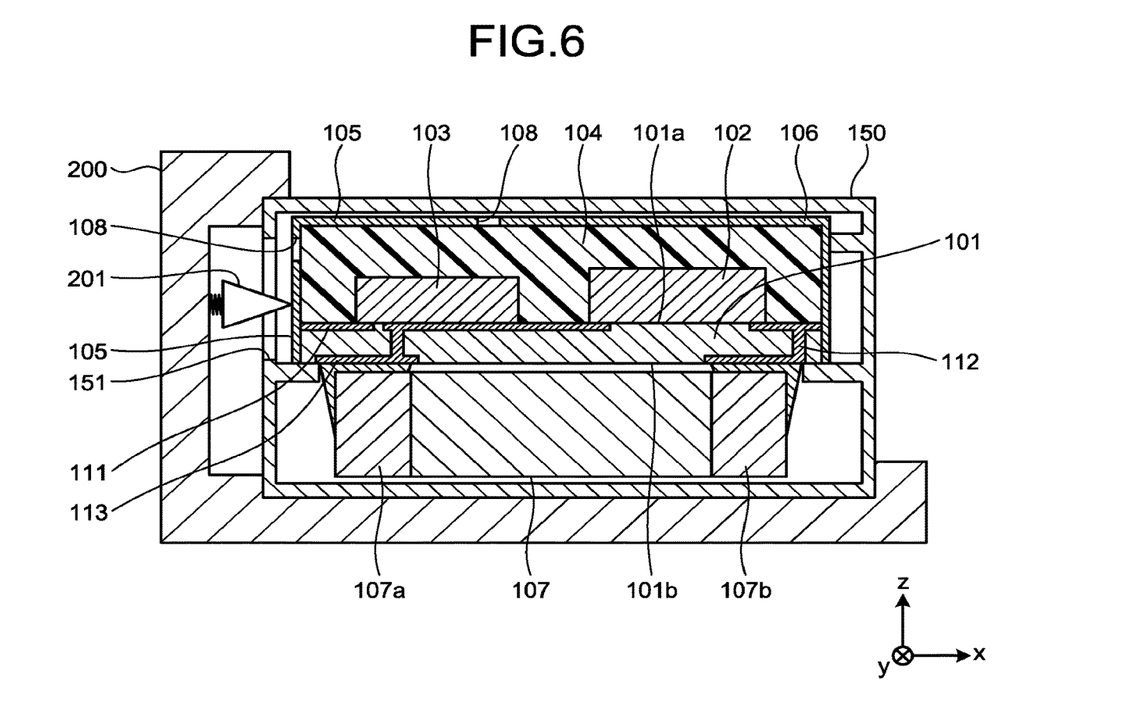
FIG. 6 is a cross-sectional view illustrating the wireless device of the first modification, attached to a charger.

To charge the rechargeable battery 107, the wireless device having the above structure is accommodated in the case 150 to be attached to the charger 200 as illustrated, for example, in FIG. 6. Thus, the plus terminal 201 of the charger 200 makes contact with the first metal film 105. Although the minus terminal 202 of the charger 200 is not illustrated in FIG. 6, the minus terminal 202 of the charger 200 may make contact with the second metal film 106 on the same plane as the first metal film 105.

Although the first metal film 105 is provided on the single side surface of the sealing resin 104 in the example of FIG. 5, the first metal film 105 may be provided across two or more side surfaces of the sealing resin 104. However, the structure of providing the first metal film 105 along/on one or two side surfaces of the sealing resin 104 allows the gap 108 for separating the first metal film 105 from the second metal film 106 to be formed without rotating the base by the use of the above-explained laser apparatus, thereby enabling manufacturing the wireless device with high productivity in a short time. Thus, the first metal film 105 is preferably provided along (on) one or two side surfaces of the sealing resin 104.

Although the first metal film 105 and the second metal film 106 are so provided as to cover all the edge surfaces of the substrate 101 in the examples illustrated in FIGS. 1 and 5, any configuration that brings the first metal film 105 into contact with the first wire 111, and the second metal film 106 with the second wire 112 may be employed. The edge surfaces of the substrate 101 may be partly uncovered.

Second Modification

The second metal film 106 has the ground potential during the operation of the wireless circuit 102 as described above. Thus, a wireless device with an antenna can be obtained by forming a slot antenna 109 at least partly in the second metal film 106 as illustrated, for example, in FIG. 7. In this case, the slot antenna 109 is formed so as not to overlap with the wireless circuit 102 as viewed in the direction (−Z direction) perpendicular to the first surface 101a of the substrate 101. This realizes the wireless device with an antenna while maintaining the function of the electromagnetic shielding by the second metal film 106.

Figure 7:
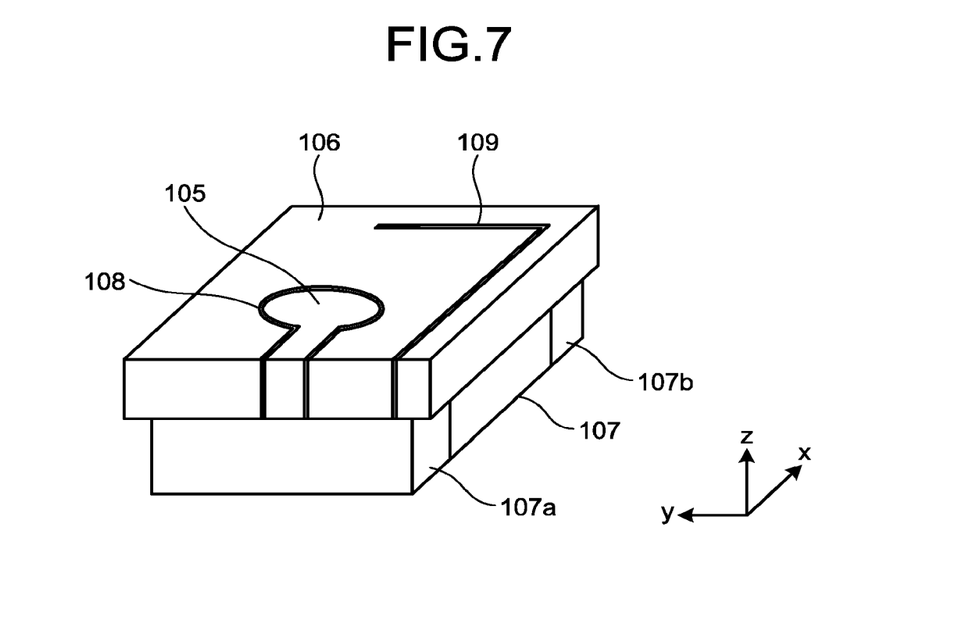
FIG. 7 is a perspective view illustrating the appearance of a wireless device of a second modification.

The slot antenna 109 is obtained by supplying power to a slit-shaped gap enclosed by the conductor to allow the slit-shaped gap to function as an antenna. The entire length (slot length) in the longitudinal direction of the slot antenna 109 is set to approximately half a wavelength of a desirable frequency used for communication of the wireless device, thereby enabling the slot antenna 109 to efficiently emit or receive an electromagnetic wave of the desirable frequency. For example, the slot antenna 109 can be formed together with the gap 108 when the gap 108 is formed in the integral metal film formed over the surface of the sealing resin 104 and the edge surfaces of the substrate 101 by using the laser apparatus.

The shape of the slot antenna 109 illustrated in FIG. 7 is only one example and is not limited to this example. Any shape that allows the slot antenna 109 to be formed at least partly in the second metal film 106 so that the slot length becomes approximately half the wavelength of the desirable frequency used for communication of the wireless device may be employed. Placing the slot antenna 109 at least partly in the same surface as the gap 108 for separating the first metal film 105 from the second metal film 106 as in the example of FIG. 7 improves workability in forming the gap 108 and the slot antenna 109 by cutting.

Figure 8:
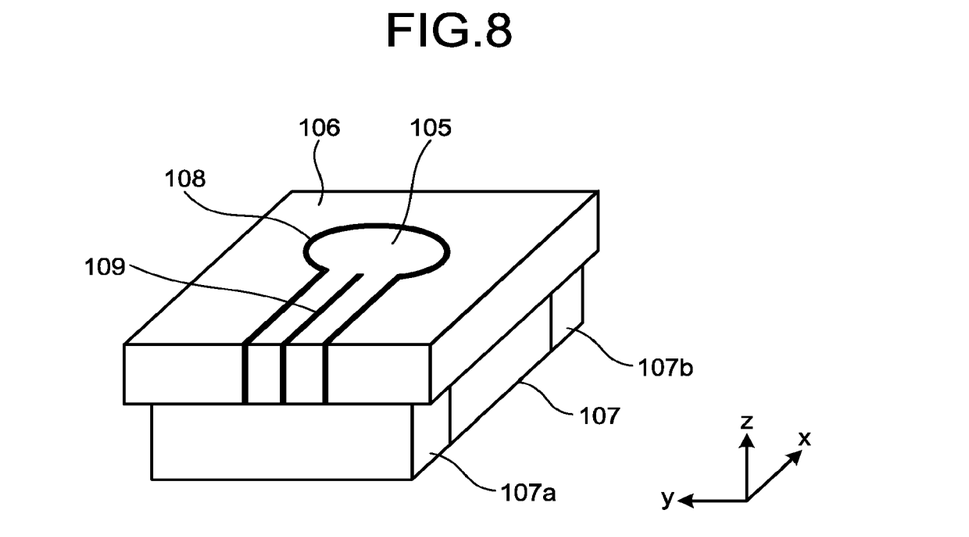
FIG. 8 is a perspective view illustrating the appearance of another wireless device of the second modification.

Additionally, the slot antenna 109 may be partly disposed in a conductive pattern having the ground potential disposed on the substrate 101. That is, a conductive pattern electrically connected to the second metal film 106 may be provided on the substrate 101, and the slot antenna 109 may be formed continuously from the second metal film 106 to the conductive pattern. The slot antenna 109 may be also at least partly disposed in the first metal film 105 having the plus potential as illustrated, for example, in FIG. 8. A conductive pattern connected to the first metal film 105 may be provided on the substrate 101, and the slot antenna may be formed continuously from the first metal film 105 to the conductive pattern. The slot antenna 109 may be partly disposed in both of the first metal film 105 and the second metal film 106.

Third Modification

In the wireless device according to the first embodiment, the rechargeable battery 107 is surface-mounted on the second surface 101b of the substrate 101. The rechargeable battery 107 is not limited to be surface-mounted on the second surface 101b of the substrate 101. Any configuration that mounts the rechargeable battery 107 on the wireless device so as to electrically connect the first electrode 107a to the first wire 111 disposed on the substrate 101 and the second electrode 107b to the second wire 112 disposed on the substrate 101 may be employed.

Figure 9:
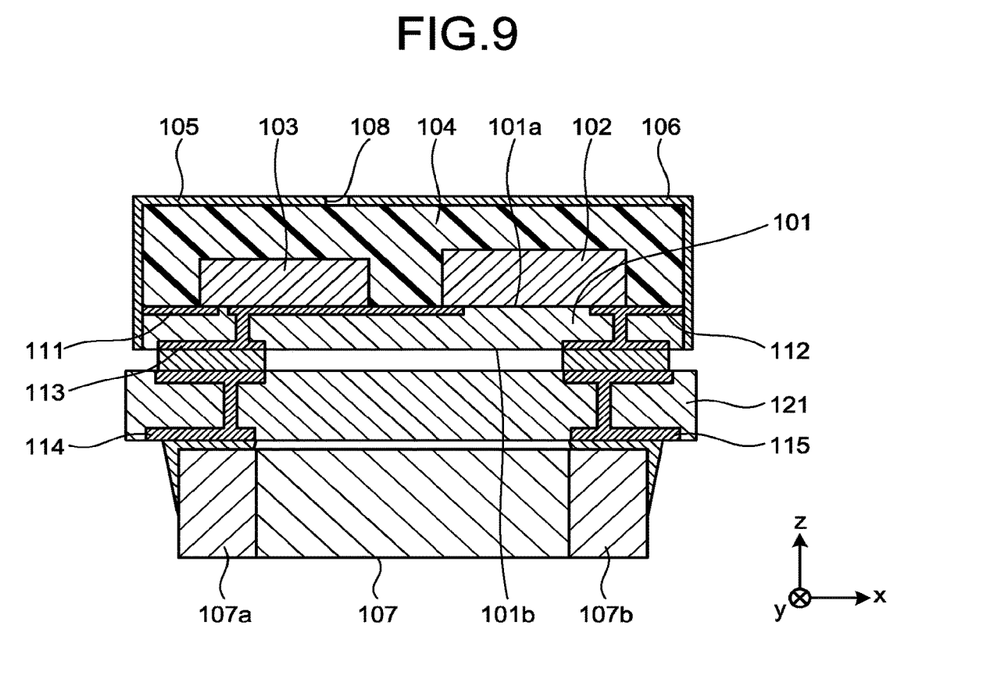
FIG. 9 is a cross-sectional view of a wireless device of a third modification.

As illustrated, for example, in FIG. 9, another substrate (a battery substrate 121) for mounting the rechargeable battery 107 thereon may be placed on the second surface 101b of the substrate 101, and the rechargeable battery 107 may be mounted on (at) the battery substrate 121. A fourth wire 114 and a fifth wire 115 are disposed on the battery substrate 121. The rechargeable battery 107 is mounted on the battery substrate 121 so as to connect the first electrode 107a to the fourth wire 114 and the second electrode 107b to the fifth wire 115. The battery substrate 121 is soldered to the second surface 101b of the substrate 101 so as to electrically connect the fourth wire 114 to the third wire 113 and the fifth wire 115 to the second wire 112.

In the example of FIG. 9, the first electrode 107a of the rechargeable battery 107 is electrically connected to the first wire 111 disposed on the substrate 101 via the fourth wire 114 of the battery substrate 121, the third wire 113 and the power circuit 103 disposed on the substrate 101. The second electrode 107b of the rechargeable battery 107 is electrically connected to the second wire 112 disposed on the substrate 101 via the fifth wire 115 of the battery substrate 121.

For the structure illustrated in FIG. 9, the rechargeable battery 107 can be mounted on the wireless device by using a relatively simple method of, for example, bonding the battery substrate 121, on which the rechargeable battery 107 has been previously mounted, to the side of the second surface 101*b* of the substrate 101 by soldering, thus improving productivity. This structure also eliminates the need for mounting a charging pad on the substrate 101 and the battery substrate 121 and mounting a charging connector on the substrate 101 and the battery substrate 121, for example. It is thus unnecessary to upsize the substrate 101 and the battery substrate 121 for charging the rechargeable battery 107.

Figure 10:
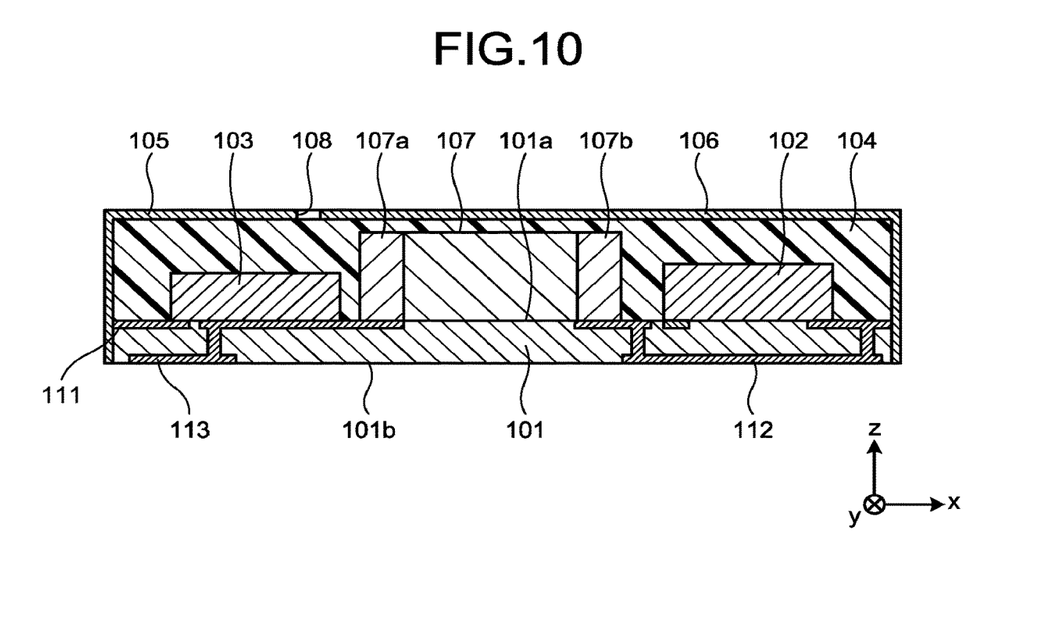
FIG. 10 is a cross-sectional view of another wireless device of the third modification.

Additionally, as illustrated, for example, in FIG. 10, such a structure may be employed that the rechargeable battery 107 is surface-mounted on the first surface 101*a* of the substrate 101, and is sealed by the sealing resin 104 as with the semiconductor devices such as the wireless circuit 102 and the power circuit 103. In this case, a solid-state battery using a solid electrolyte is preferably used as the rechargeable battery 107.

Surface-mounting the rechargeable battery 107 on the first surface 101*a* of the substrate 101 as in the example of FIG. 10 enables the thickness dimension of the substrate 101 to be reduced (thinned) though the surface dimensions of the substrate 101 are increased.

Second Embodiment

Subsequently, a second embodiment will be described. A wireless device according to the second embodiment employs a commercially available lithium-ion polymer battery as an example of the rechargeable battery 107 mounted on the wireless device. The commercially available lithium-ion polymer battery includes a power circuit, to which a connector is connected via a cable. A first electrode (positive electrode) of the lithium-ion polymer battery is electrically connected to a positive electrode terminal of the connector via the power circuit, and a second electrode (negative electrode) of the lithium-ion polymer battery is electrically connected to a negative electrode terminal of the connector via the power circuit. The rechargeable battery 107 mounted on the wireless device according to the present embodiment is designated by reference numeral 107' below, differently from the first embodiment.

Figure 11:
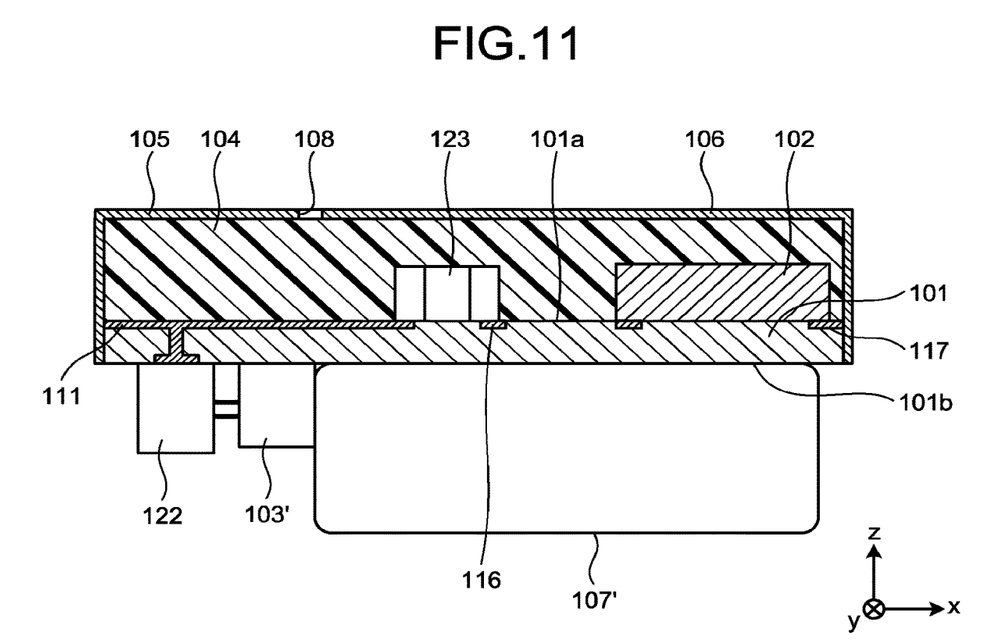
FIG. 11 is a side view of a wireless device according to a second embodiment.
Figure 12:
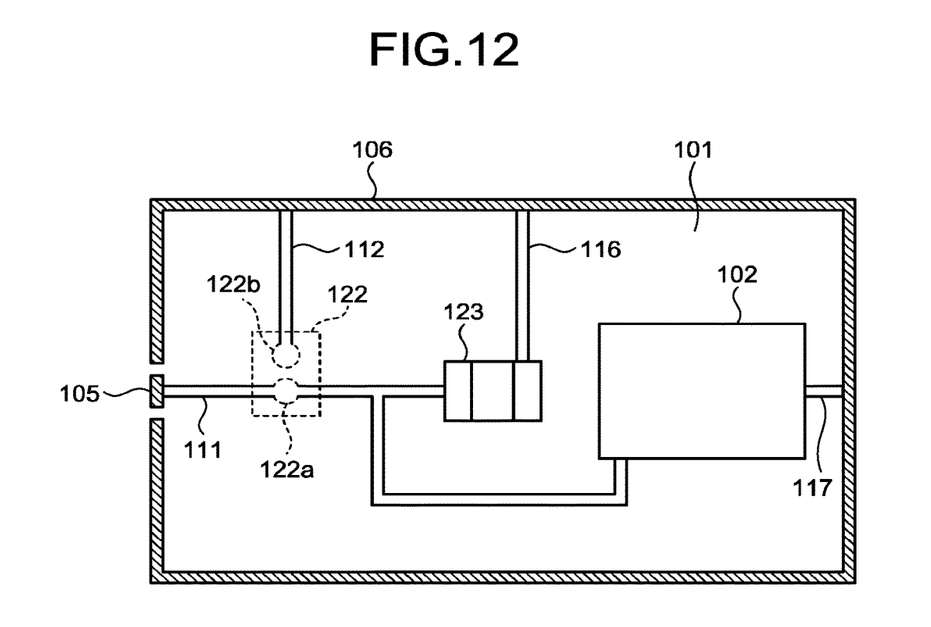
FIG. 12 is a plan view illustrating an example of wires disposed on a substrate.
Figure 13:
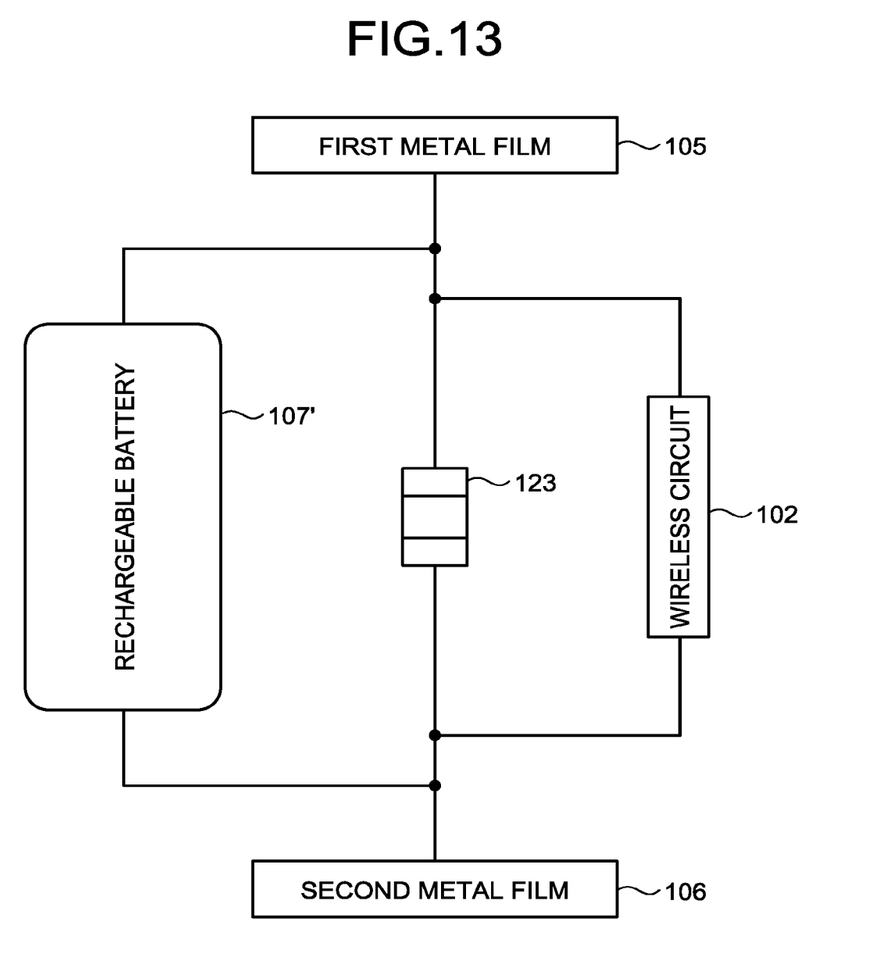
FIG. 13 is a schematic view illustrating an example of a circuit configuration for supplying power to a wireless circuit.

FIG. 11 is a cross-sectional view of the wireless device according to the second embodiment, on a plane at the same position as in FIG. 2 as viewed in a y direction in the drawing. FIG. 12 is a plan view (XY plan view of the substrate 101 as viewed in the Z direction) illustrating an example of wires disposed on the substrate 101 of the wireless device according to the second embodiment. FIG. 13 is a schematic view illustrating an example of a circuit configuration for supplying power to the wireless circuit 102.

In the wireless device according to the second embodiment, the rechargeable battery 107' formed from the lithium-ion polymer battery is mounted on the second surface 101*b* of the substrate 101 as illustrated in FIG. 11. Since the rechargeable battery 107' includes a power circuit 103', the power circuit 103 is not mounted on the first surface 101*a* of the substrate 101 in the present embodiment. Alternatively, a capacitor 123 for stabilizing the voltage of power supplied to the wireless circuit 102 is mounted on the first surface 101*a* of the substrate 101.

A connector 122 of the rechargeable battery 107' is mounted on the second surface 101*b* of the substrate 101 so as to connect a positive electrode terminal 122*a* to the first wire 111 disposed on the substrate 101 and a negative electrode terminal 122*b* to the second wire 112 disposed on the substrate 101 as illustrated in FIG. 12. Thus, the first electrode of the rechargeable battery 107' is electrically connected to the first wire 111 disposed on the substrate 101 via the power circuit 103' and the connector 122, and the second electrode of the rechargeable battery 107' is electrically connected to the second wire 112 disposed on the substrate 101 via the power circuit 103' and the connector 122.

In the present embodiment, the first wire 111 disposed on the substrate 101 is electrically connected to the first metal film 105, and the second wire 112 disposed on the substrate 101 is electrically connected to the second metal film 106 similarly to the first embodiment (see FIG. 12). Consequently, the first metal film 105 and the second metal film 106 can be used as a charging pad for charging the rechargeable battery 107'.

The capacitor 123 is mounted on the first surface 101*a* of the substrate 101 so as to connect a positive electrode side to the first wire 111 and a negative electrode side to a sixth wire 116 electrically connected to the second metal film 106 as illustrated in FIG. 12. A ground terminal of the wireless circuit 102 is connected to the second metal film 106 via a seventh wire 117.

By employing the above structure, the wireless device according to the second embodiment provides a circuit configuration in which the rechargeable battery 107' is connected to the first metal film 105 and the second metal film 106, and the wireless circuit 102 and the capacitor 123 are connected in parallel with the rechargeable battery 107' as illustrated in FIG. 13.

When the wireless device according to the second embodiment is attached to the charger 200 similarly to the first embodiment, the first metal film 105 has the same potential as the plus electrode of the charger 200, and the second metal film 106 as the ground electrode of the charger 200. The charger 200 supplies an electric current to the rechargeable battery 107' through the first metal film 105, the first wire 111, the connector 122 and the power circuit 103' to charge the rechargeable battery 107'. Since the wireless circuit 102 and the capacitor 123 are connected in parallel with the rechargeable battery 107', the wireless circuit 102 can be stably supplied with power during operation.

In the wireless device according to the second embodiment, the first metal film 105 and the second metal film 106 provided along each surface of the sealing resin 104 for sealing the wireless circuit 102 and the capacitor 123 mounted on the first surface 101*a* of the substrate 101, to the edge surfaces of the substrate 101 function as the charging pad for charging the rechargeable battery 107' as described above, similarly to the first embodiment. Consequently, the wireless device according to the second embodiment enables charging of the rechargeable battery 107' while achieving size reduction, similarly to the first embodiment.

Since the commercially available lithium-ion polymer battery is mounted as the rechargeable battery 107', component procurement costs can be reduced. Therefore, the wireless device according to the second embodiment can be inexpensively manufactured.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An electronic apparatus comprising:
   a substrate;
   a semiconductor device mounted on a first surface of the substrate and including a wireless circuit;
   a non-conductive portion formed on the first surface of the substrate to seal the semiconductor device;
   a first metal film provided along from a surface of the non-conductive portion to at least one edge surface of the substrate to make contact at the edge surface with a first wire disposed on the substrate;
   a second metal film provided along from the surface of the non-conductive portion to the at least one edge surface of the substrate and separately from the first metal film to be electrically insulated from the first metal film and to make contact at the edge surface with a second wire disposed on the substrate; and
   a rechargeable battery including a first electrode electrically connected to the first wire, and a second electrode electrically connected to the second wire, wherein
   the first metal film and the second metal film are configured to function as a charging pad that makes contact with terminals of a charger for charging the rechargeable battery.

2. The electronic apparatus according to claim 1, wherein the rechargeable battery is mounted on a second surface of the substrate.

3. The electronic apparatus according to claim 1, further comprising a battery substrate placed opposite to a second surface of the substrate,
   wherein the rechargeable battery is mounted on the battery substrate.

4. The electronic apparatus according to claim 1, wherein the rechargeable battery is mounted on the first surface of the substrate and is sealed as with the semiconductor device by the non-conductive portion.

5. The electronic apparatus according to claim 1, wherein the first electrode of the rechargeable battery is electrically connected to the first wire via a third wire and a power circuit disposed on the substrate.

6. The electronic apparatus according to claim 1, wherein the second metal film is provided so as to partly overlap with the semiconductor device as viewed in a direction perpendicular to the first surface of the substrate.

7. The electronic apparatus according to claim 1, wherein the surface of the non-conductive portion includes an upper surface parallel with the first surface of the substrate, and a side surface intersecting with the upper surface, and
   the first metal film is provided along from the side surface of the non-conductive portion to the at least one edge surface of the substrate.

8. The electronic apparatus according to claim 1, wherein the first metal film and the second metal film are formed by cutting an integral metal film formed along from the surface of the non-conductive portion to the at least one edge surface of the substrate to form a slit-shaped gap, and
   the integral metal film is separated into the first metal film and the second metal film by the gap.

9. The electronic apparatus according to claim 1, wherein, in at least one of the first metal film and the second metal film, at least a portion of a slot antenna is located.

10. A method of manufacturing an electronic apparatus, the method comprising:
    forming an integral metal film along from a surface of a non-conductive portion for sealing a semiconductor device mounted on a first surface of a substrate to at least one edge surface of the substrate; and
    forming a slit-shaped gap by cutting the integral metal film to separate the integral metal film into a first metal film and a second metal film to be electrically insulated from each other, wherein
    the first metal film contacts with a first wire disposed on the substrate at the at least one edge surface of the substrate,
    the second metal film contacts with a second wire disposed on substrate at the at least one edge surface of the substrate,
    the first wire is electrically connected to a first electrode of a rechargeable battery, the second wire is electrically connected to a second electrode of the rechargeable battery, and
    the first metal film and the second metal film are configured to function as a charging pad that makes contact with terminals of a charger for charging the rechargeable battery.

* * * * *